United States Patent
Saboundji et al.

(10) Patent No.: US 11,248,476 B2
(45) Date of Patent: Feb. 15, 2022

(54) TURBINE PART MADE OF SUPERALLOY COMPRISING RHENIUM AND/OR RUTHENIUM AND ASSOCIATED MANUFACTURING METHOD

(71) Applicant: SAFRAN, Paris (FR)

(72) Inventors: Amar Saboundji, Moissy-Cramayel (FR); Virginie Jaquet, Moissy-Cramayel (FR)

(73) Assignee: SAFRAN, Paris (FR)

( * ) Notice: Subject to any disclaimer, the term of this patent is extended or adjusted under 35 U.S.C. 154(b) by 75 days.

(21) Appl. No.: 16/649,397

(22) PCT Filed: Sep. 21, 2018

(86) PCT No.: PCT/FR2018/052314
§ 371 (c)(1),
(2) Date: Mar. 20, 2020

(87) PCT Pub. No.: WO2019/058068
PCT Pub. Date: Mar. 28, 2019

(65) Prior Publication Data
US 2020/0248562 A1    Aug. 6, 2020

(30) Foreign Application Priority Data
Sep. 21, 2017  (FR) ...................................... 1700965

(51) Int. Cl.
*F01D 5/28*        (2006.01)
*C23C 4/08*        (2016.01)
(Continued)

(52) U.S. Cl.
CPC ............. *F01D 5/288* (2013.01); *C23C 4/073* (2016.01); *C23C 4/08* (2013.01); *C23C 14/16* (2013.01);
(Continued)

(58) Field of Classification Search
CPC ....................................................... F01D 5/288
See application file for complete search history.

(56) References Cited

U.S. PATENT DOCUMENTS

2006/0093851 A1    5/2006  Darolia et al.
2009/0185944 A1    7/2009  Hu
(Continued)

FOREIGN PATENT DOCUMENTS

EP    1 652 964 A1    5/2006
EP    3 048 187 A1    7/2016

OTHER PUBLICATIONS

Plasma Electronic, "Physical Vapor Deposition (PVD)" https://www.plasma-electronics.com/physical-vapor-deposition.html (Year: 2021).*
(Continued)

*Primary Examiner* — Topaz L. Elliott
(74) *Attorney, Agent, or Firm* — Oblon, McClelland, Maier & Neustadt, L.L.P.

(57) ABSTRACT

A turbine part, such as a turbine blade or a distributor fin, for example, including a substrate made of superalloy based on monocrystalline nickel, including rhenium and/or ruthenium, and having a γ'-Ni3Al phase that is predominant by volume and a γ-Ni phase, the part also including a sublayer made of metal superalloy based on nickel covering the substrate, wherein the sublayer has a γ'-Ni3Al phase that is predominant by volume and wherein the sublayer has an average atomic fraction of aluminium of between 0.15 and 0.25, of chromium of between 0.03 and 0.08, of platinum of between 0.01 and 0.05, of hafnium of less than 0.01 and of silicon of less than 0.01. A process for manufacturing a turbine part including a step of vacuum deposition of a sublayer made of a superalloy based on nickel having (Continued)

predominantly by volume a γ'-NisAl phase, on a substrate made of superalloy based on nickel including rhenium and/or ruthenium.

13 Claims, 1 Drawing Sheet

(51) Int. Cl.

| | |
|---|---|
| *C23C 14/16* | (2006.01) |
| *C23C 28/00* | (2006.01) |
| *C23C 4/073* | (2016.01) |
| *C22C 19/05* | (2006.01) |
| *C23C 4/137* | (2016.01) |
| *C23C 28/02* | (2006.01) |
| *C22C 19/00* | (2006.01) |

(52) U.S. Cl.
CPC .......... *C23C 28/321* (2013.01); *C23C 28/324* (2013.01); *C23C 28/345* (2013.01); *C22C 19/007* (2013.01); *C22C 19/057* (2013.01); *C23C 4/137* (2016.01); *C23C 28/027* (2013.01); *F05D 2220/32* (2013.01); *F05D 2230/31* (2013.01); *F05D 2230/311* (2013.01); *F05D 2230/313* (2013.01); *F05D 2230/90* (2013.01); *F05D 2300/132* (2013.01); *F05D 2300/143* (2013.01); *F05D 2300/1432* (2013.01); *F05D 2300/175* (2013.01); *F05D 2300/182* (2013.01); *F05D 2300/607* (2013.01)

(56) References Cited

U.S. PATENT DOCUMENTS

| | | | |
|---|---|---|---|
| 2010/0330295 A1 | 12/2010 | Hazel et al. | |
| 2011/0081235 A1* | 4/2011 | Shah | F03G 7/06 |
| | | | 415/170.1 |
| 2013/0095346 A1 | 4/2013 | Wu et al. | |
| 2016/0168661 A1 | 6/2016 | Yoshizawa et al. | |
| 2017/0306451 A1* | 10/2017 | Dheeradhada | C23C 30/00 |
| 2018/0066340 A1* | 3/2018 | Reed | C22C 19/057 |

OTHER PUBLICATIONS

TMS "Compositions of Typical Cast Superalloys" https://www.tms.org/communities/ftattachments/superalloystable_castcomp.pdf (Year: 2021).*

Bowman, Randy. "Superalloys: A Primerand history" https://www.tms.org/Meetings/Specialty/Superalloys2000/SuperalloysHistory.html captured as of May 24, 2015 (Year: 2015).*

International Search Report dated Jan. 30, 2019 in PCT/FR2018/052314 filed Sep. 21, 2018, 3 pages.

* cited by examiner

TURBINE PART MADE OF SUPERALLOY COMPRISING RHENIUM AND/OR RUTHENIUM AND ASSOCIATED MANUFACTURING METHOD

FIELD OF THE INVENTION

The invention relates to a turbine part, such as a turbine blade or a nozzle vane for example, used in aeronautics.

PRIOR ART

In a turbojet engine, the exhaust gases generated by the combustion chamber can reach high temperatures, above 1200° C. or even 1600° C. The parts of the turbojet engine in contact with these exhaust gases, such as the turbine blades for example, must therefore be able to maintain their mechanical properties at these high temperatures.

For this purpose, it is known to manufacture certain parts of the turbojet engine in "superalloy". Superalloys are a family of high-strength metal alloys that can work at temperatures relatively close to their melting points (typically 0.7 to 0.8 times their melting temperatures).

In order to increase the thermal resistance of these superalloys and to protect them against oxidation and corrosion, it is known to coat them with a coating that acts as a thermal barrier.

FIG. 1 shows a schematic illustration of a section of a turbine part 1, for example a turbine blade 6 or a nozzle vane. The part 1 comprises a substrate 2 made of a single-crystal metal superalloy coated with a thermal barrier 10.

The thermal barrier typically consists of a metal bond coat, a protective layer and a thermal insulating layer. The metal bond coat covers the metal superalloy substrate. The metal bond coat is itself covered by the protective layer, which is formed by oxidation of the metal bond coat. The protective layer protects the superalloy substrate from corrosion and/or oxidation. The thermally insulating layer covers the protective layer. The thermally insulating layer can be made of ceramic, for example yttriated zirconia.

The bond coat can be made from single nickel aluminide ß-NiAl or modified platinum ß-NiAlPt. The average aluminum atomic fraction (between 0.35 and 0.45) of the bond coat is sufficient to form exclusively a protective layer of aluminum oxide ($Al_2O_3$) to protect the superalloy substrate against oxidation and corrosion.

However, when the part is subjected to high temperatures, the difference in the concentrations of nickel, and especially aluminum, between the superalloy substrate and the metal bond coat leads to diffusion of the various elements, in particular from the nickel in the substrate to the metal bond coat, and from the aluminum in the metal bond coat to the superalloy. This phenomenon is called "interdiffusion".

Interdiffusion can lead to the formation of primary and secondary reaction zones (SRZ) in a portion of the substrate in contact with the bond coat.

FIG. 2 is a microphotograph of the section of a bond coat 3a covering a substrate 2. The microphotograph is taken before the part is subjected to a series of thermal cycles to simulate the temperature conditions of the part 1 in use. The substrate 2 is rich in rhenium, i.e. the average mass fraction of rhenium is greater than or equal to 0.04. It is known to use rhenium in the composition of superalloys to increase the creep resistance of superalloy parts. Typically, the substrate 2 has a γ-Ni phase. The substrate 3a is of ß-NiAlPt type. The substrate has a primary interdiffusion zone 5, in the part of the substrate directly covered by the bond coat 3a. The substrate 2 also has a secondary interdiffusion zone 7, directly covered by the primary interdiffusion zone 5. The thickness of the secondary interdiffusion zone 7 shown in FIG. 2 is approximately 35 μm.

FIG. 3 is a microphotograph of the section of the bond coat 3a covering the substrate 2. The microphotograph shows the bond coat 3a and the substrate 2 after subjecting them to the series of thermal cycles described above. The bond coat 3a covers the substrate 2. The substrate 2 has a primary interdiffusion zone 5 and a secondary interdiffusion zone 7. Locally, the thickness of the secondary interdiffusion zone 7 can be up to 150 μm, as represented by the white segment in FIG. 3.

Interdiffusion phenomena lead to premature depletion of the aluminum bond coat, which favors phase transformations in the bond coat (ß-NiAl→γ'—$Ni_3Al$, martensitic transformation). These transformations modify the allotropic structure of the bond coat 3a and generate cracks 8 in the bond coat, promoting rumpling of the protective aluminum oxide layer.

Thus, interdiffusions between the superalloy substrate and the bond coat can have adverse consequences on the service life of the superalloy part.

SUMMARY OF THE INVENTION

A purpose of the invention is to provide a solution to effectively protect a superalloy turbine part from oxidation and corrosion, while increasing its service life, during use, compared to known parts.

Another purpose of the invention is to provide a solution to avoid or limit the formation of secondary reaction zones in the substrate and the peeling of the protective aluminum oxide layer.

This purpose is achieved in the present invention by means of a turbine part comprising a substrate made of a single-crystal nickel-based superalloy, comprising rhenium and/or ruthenium, and having a γ'-$Ni_3Al$ phase which is predominant in volume and a γ-Ni phase, and a bond coat made of a nickel-based metal superalloy covering the substrate, characterized in that the bond coat has a γ'-$Ni_3Al$ phase which is predominant by volume and in that the bond coat has an average atomic fraction of aluminum of between 0.15 and 0.25, of chromium of between 0.03 and 0.08, of platinum of between 0.01 and 0.05, of hafnium of less than 0.01 and of silicon of less than 0.01.

As the metal bond coat has an allotropic structure close to the substrate structure, the formation of secondary reaction zones is prevented and/or limited.

Furthermore, as the composition of the metallic bond coat corresponds to the composition of a bond coat under working conditions at a time following a martensitic transition, the allotropic structure of the bond coat limits or prevents the formation of secondary reaction zones while having a chemical composition adapted to increase the time, under working conditions, during which the protective bond coat can be formed.

In addition, the turbine part may have the following characteristics:
  the bond coat has a γ'-$Ni_3Al$ phase greater than 95% by volume;
  the bond coat has a γ'-$Ni_3Al$ phase and a ß-NiAlPt phase;
  the bond coat has a γ'-$Ni_3Al$ phase and a γ-Ni phase;
  the mass fraction of rhenium in the substrate is greater than or equal to 0.04;

the bond coat further comprises at least one element selected from cobalt, molybdenum, tungsten, titanium, tantalum;

a protective layer of aluminum oxide covers the bond coat;

a thermally insulating ceramic layer covers the protective layer;

the thickness of the bond coat is between 5 µm and 50 µm.

The invention further relates to a turbine blade characterized in that it comprises a part as previously defined.

The invention further relates to a gas turbine engine characterized in that it comprises a turbine comprising a turbine blade as previously defined.

The invention further relates to a process for manufacturing a turbine part comprising a step of vacuum deposition of a bond coat of a nickel-based superalloy having a γ'-Ni$_3$Al phase predominantly in volume, on a substrate made of a nickel-based superalloy comprising rhenium and/or ruthenium, the bond coat having an average atomic fraction:

of aluminum between 0.15 and 0.25;
of chromium between 0.03 and 0.08;
of platinum between 0.01 and 0.05;
of hafnium less than 0.01 and
of silicon less than 0.01.

Deposition can be carried out by a method selected from physical vapor deposition, thermal spraying, Joule evaporation, pulsed laser ablation and sputtering.

The bond coat can be deposited by co-spraying and/or co-evaporating metal targets.

PRESENTATION OF THE DRAWINGS

Other features and advantages will be further highlighted in the following description, which is purely illustrative and non-limiting, and should be read in conjunction with the appended figures, among which:

Figure 1:
FIG. 1 shows a schematic diagram of the cross-section of a turbine part, for example a turbine blade or a nozzle vane.
Figure 2:
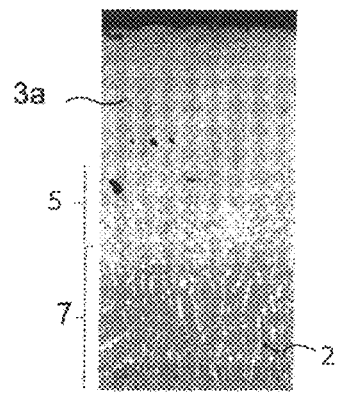
FIG. 2 is a microphotograph of the section of a bond coat covering the substrate.
Figure 3:
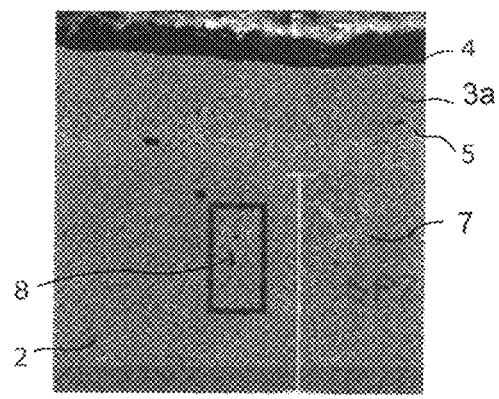
FIG. 3 is a microphotograph of the section of a bond coat covering the substrate.
Figure 4:
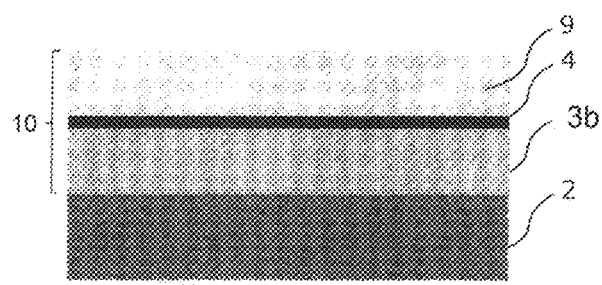
Figure 5:
Figure 6:
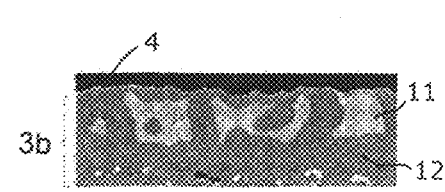

FIG. 4 schematically illustrates the section of a thermal barrier covering the substrate of a turbine part according to an embodiment of the invention;

FIG. 5 is a microphotograph of the section of a bond coat covering a substrate after heat treatment;

FIG. 6 is a microphotograph of the section of a bond coat covering the substrate after heat treatment.

DEFINITIONS

The term "superalloy" refers to a complex alloy with very good resistance to oxidation, corrosion, creep and cyclic (especially mechanical or thermal) stress at high temperature and pressure. Superalloys have a particular application in the manufacture of parts used in aeronautics, for example turbine or gas turbine engine blades, as they constitute a family of high-strength alloys that can work at temperatures relatively close to their melting points (typically 0.7 to 0.8 times their melting temperatures).

A superalloy may have a two-phase microstructure comprising a first phase (called "γ phase") forming a matrix, and a second phase (called "γ' phase") forming precipitates hardening in the matrix.

The "base" of the superalloy is the main metal component of the matrix. In the majority of cases, superalloys include an iron, cobalt, or nickel base, but sometimes also a titanium or aluminum base.

"Nickel-base superalloys" have the advantage of offering a good compromise between oxidation resistance, high temperature fracture resistance and weight, which justifies their use in the hottest parts of turbojet engines.

Nickel-base superalloys consist of a γ phase (or matrix) of the face-centered austenitic cubic γ-Ni type, optionally containing additives in solid solution of α substitution (Co, Cr, W, Mo), and a γ' phase (or precipitates) of type γ'-Ni$_3$X, with X=Al, Ti or Ta. The γ' phase has an ordered L$_{12}$ structure, derived from the face-centered cubic structure, coherent with the matrix, i.e. having an atomic lattice very close thereto.

Due to its orderly character, the γ' phase has the remarkable property of having a mechanical resistance that increases with temperature up to about 800'C. The coherence between the γ and γ' phases confers a very high hot mechanical strength of nickel-based superalloys, which itself depends on the ratio γ/γ' and the size of the hardening precipitates.

A superalloy is, in all the embodiments of the invention, rich in rhenium and/or ruthenium i.e. the average atomic fraction of rhenium and/or ruthenium in the superalloy is greater than or equal to 0.04. The presence of rhenium increases the creep resistance of the superalloy parts compared to the rhenium-free superalloy parts without ruthenium. In addition, the presence of ruthenium improves the distribution of refractory chemical elements in the γ and γ' phases.

Nickel-based superalloys thus generally have a high mechanical strength up to 700° C., then a mechanical strength that decreases sharply above 800° C.

The term "atomic fraction" refers to the concentration.

DETAILED DESCRIPTION OF THE INVENTION

FIG. 4 schematically illustrates a section of thermal barrier 10 covering the substrate 2 of a turbine part 1.

The components shown in FIG. 4 may be independently representative of the components of a turbine blade 6, a nozzle vane, or any other component, part or piece of a turbine.

The substrate 2 is formed from a nickel-based superalloy comprising rhenium and/or ruthenium. The average mass fraction of the rhenium and/or ruthenium substrate 2 is greater than or equal to 0.04 and preferentially between 0.045 and 0.055.

The thermal barrier consists of a metal bond coat 3b, a protective layer 4 and a thermal insulating layer 9.

The substrate 2 is covered by the metallic bond coat 3b. The metal layer 3b is covered by the protective layer 4. The protective layer 4 is covered by the thermally insulating layer 9.

The composition of the deposited metallic bond coat 3b has an average atomic fraction of aluminum between 0.15 and 0.25, preferentially between 0.19 and 0.23, of chromium between 0.03 and 0.08, preferentially between 0.03 and 0.06, of platinum between 0.01 and 0.05, of hafnium less than 0.01, preferentially less than 0.008, and of silicon less than 0.01, preferentially less than 0.008. The preferential composition is described in Table 1 below, the average atomic fraction being given in percent.

TABLE 1

| Ni (% At) | Al (% At) | Cr (% At) | Pt (% At) | Hf (% At) | If (% At) |
|---|---|---|---|---|---|
| base | 19-23 | 3-6 | 1-5 | 0-0.8 | 0-0.8 |

The metallic bond coat 3b has a γ'-Ni$_3$Al phase 12 majority by volume. Thus, the allotropic structure of the bond coat 3b is close to the structure of the substrate 2, preventing the formation of secondary reaction zones during the use of the turbine part 1 at temperatures above 900° C., and preferentially above 1100'C. Advantageously, the γ'-Ni$_3$Al phase is greater than 95% by volume in the metal bond coat. Apart from the γ'-Ni$_3$Al phase, the metal bond coat 3b may have a ß-NiAlPt phase or a γ-Ni phase.

The chemical composition and the allotropic structure of the bond coat 3b were determined by analyzing the chemical composition and structure of a bond coat 3b, initially of type ß-NiAlPt, directly after a martensitic transformation phase during a treatment of the bond coat 3b simulating the thermal conditions of use of the part 1.

FIG. 5 is a microphotograph of the section of a bond coat 3a, different from a bond coat of the invention, covering a substrate after heat treatment. The substrate covered by the bond coat 3a is a substrate made of a nickel-based superalloy of the AM1 type, comprising neither rhenium nor ruthenium. The part comprising the bond coat 3a has been treated by a series of 250 thermal cycles, each cycle corresponding to a thermal treatment of the part comprising the bond coat 3a at a temperature of 1100° C. for 60 minutes. The majority of the volume of the bond coat 3a is a ß-NiAlPt phase 11 and the minority is a γ'-Ni$_3$Al phase 12. The bond coat 3a is covered by a protective layer 4. The interface between the bond coat 3a and the protective layer 4 is very irregular: it has a roughness high enough to cause the protective layer 4 to flake (or rumple) when the part is used. This roughness is caused during heat treatment by martensitic transformations of the ß-NiAlPt phases 11 in the bond coat 3a.

FIG. 6 is a microphotograph of the section of a bond coat 3b, in accordance with an embodiment of the invention, covering a substrate 2 made of a single-crystal nickel-based superalloy comprising rhenium and/or ruthenium, after a heat treatment. The part comprising the bond coat 3b has been treated by a series of 500 thermal cycles, each cycle corresponding to a heat treatment of the part 1 comprising the bond coat 3b at a temperature of 1100° C. for 60 minutes. The majority of the volume of the bond coat 3b is a γ'-Ni$_3$Al phase 12 and the minority is a ß-NiAlPt phase 11. The bond coat 3a is covered by a protective layer 4. The interface between the bond coat 3b and the protective layer 4 has a lower roughness than the roughness between the bond coat 3a and the protective layer 4 shown in FIG. 5, despite a heat treatment of the system comprising the bond coat 3b that is longer than the heat treatment described with reference to FIG. 5. This difference in roughness is associated with a faster martensitic transformation of the ß-NiAlPt phases 11 of the bond coat 3b than that of the ß-NiAlPt phases 11 of the bond coat 3a. In addition, the bond coat 3b illustrated in FIG. 6 presents mainly by volume a γ'-Ni$_3$Al phase 12 and less by volume a ß-NiAlPt phase 11.

The allotropic structure and the chemical composition of the bond coat 3b after 500 thermal cycles were analyzed and selected. This structure and composition correspond to the structure and compositions described above, particularly in Table 1.

Thus, due to a γ'-Ni$_3$Al phase 12 majority in volume and due to the composition described in Table 1, the bond coat 3b is subject little if at all to the martensitic transformations leading to the rumpling phenomenon, while presenting a composition that increases the time, under working conditions, during which the protective bond coat 4 can be formed.

The bond coat 3b can be deposited under vacuum, for example by means of physical vapor deposition (PVD). Different PVD methods can be used for the manufacture of the bond coat 3b, such as sputtering, Joule evaporation, laser ablation and electron beam assisted physical vapor deposition. The bond coat 3b can also be deposited by thermal spraying.

Thus, the bond coat 3b can be deposited on the substrate 2 by presenting, before any heat treatment, a chemical composition and an allotropic structure adapted to avoid the rumpling phenomenon.

These deposition methods also simplify the formation of the bond coat 3b on the substrate 2 as well as better control of the chemical composition of the bond coat 3b.

Finally, these deposition methods allow precise control of the thickness of the bond coat 3b, unlike the methods of metal bond coat formation by chemical element diffusion. Advantageously, the thickness of the bond coat 3b is between 5 µm and 50 µm.

Several targets of different metallic materials can be used in parallel, simultaneously, when depositing a bond coat 3b. This type of deposition can be carried out by co-evaporation or by co-sputtering: the rate, respectively of evaporation or sputtering imposed on each target during the deposition of the bond coat 3b then determines the stoichiometry of said layer.

The invention claimed is:

1. A turbine part comprising:
   a substrate made of a single-crystal nickel-base superalloy, comprising at least one of rhenium or ruthenium, and having a γ'-Ni$_3$Al phase which is predominant in volume and a γ-Ni phase, and
   a bond coat made of a nickel-based metal superalloy covering the substrate,
   wherein the bond coat has a γ'-Ni$_3$Al phase of majority volume,
   wherein the bond coat has an average atomic fraction:
      of aluminum between 0.15 and 0.25;
      of chromium between 0.03 and 0.08;
      of platinum between 0.01 and 0.05;
      of hafnium less than 0.01 and
      of silicon less than 0.01, and
   wherein the part comprises a protective layer of aluminum oxide covering the bond coat.

2. The part as claimed in claim 1, wherein the bond coat has the γ'-Ni$_3$Al phase greater than 95% by volume.

3. The part as claimed in claim 1, wherein the bond coat has the γ'-Ni$_3$Al phase and a β-NiAlPt phase.

4. The part as claimed in claim 1, wherein the bond coat has the γ'-Ni$_3$Al phase and a γ-Ni phase.

5. The part as claimed in claim 1, wherein the rhenium mass fraction of the substrate is greater than or equal to 0.04.

6. The part as claimed in claim 1, wherein the bond coat further comprises at least one element selected from cobalt, molybdenum, tungsten, titanium, and tantalum.

7. The part as claimed in claim 1, further comprising a thermally insulating ceramic layer covering the protective layer.

8. The part as claimed in claim 1, wherein a thickness of the bond coat is between 5 µm and 50 µm.

9. A turbine blade comprising:
a turbine part comprising
   a substrate made of a single-crystal nickel-base superalloy, comprising at least one of rhenium or ruthenium, and having a γ'-Ni$_3$Al phase which is predominant in volume and a γ-Ni phase, and
   a bond coat made of a nickel-based metal superalloy covering the substrate,
wherein the bond coat has a γ'-Ni$_3$Al phase of majority volume,
wherein the bond coat has an average atomic fraction:
   of aluminum between 0.15 and 0.25;
   of chromium between 0.03 and 0.08;
   of platinum between 0.01 and 0.05;
   of hafnium less than 0.01 and
   of silicon less than 0.01, and
wherein the part comprises a protective layer of aluminum oxide covering the bond coat.

10. A gas turbine engine comprising a turbine comprising the turbine blade as claimed in claim 9.

11. A process for manufacturing a turbine part comprising:
   a step of vacuum deposition of a bond coat of a nickel-based superalloy having a γ'-Ni$_3$Al phase predominantly in volume, on a substrate made of a nickel-based superalloy comprising at least one of rhenium or ruthenium, the bond coat having an average atomic fraction:
   of aluminum between 0.15 and 0.25;
   of chromium between 0.03 and 0.08;
   of platinum between 0.01 and 0.05;
   of hafnium less than 0.01 and
   of silicon less than 0.01; and
   a step of formation of a protective layer of aluminum oxide covering the bond coat.

12. The process as claimed in claim 11, wherein the deposition is carried out by a method selected from physical vapor deposition, thermal spraying, Joule evaporation, pulsed laser ablation and sputtering.

13. The process as claimed in claim 11, wherein the bond coat is deposited by at least one of co-spraying or co-evaporating metal targets.

* * * * *